United States Patent
Gould et al.

(10) Patent No.: US 10,522,850 B2
(45) Date of Patent: Dec. 31, 2019

(54) THREE-DIMENSIONALLY PRINTED BIPOLAR PLATE FOR A PROTON EXCHANGE MEMBRANE FUEL CELL

(71) Applicants: Benjamin D. Gould, Alexandria, VA (US); Ravi Ramamurti, Silver Spring, MD (US); Karen Swider-Lyons, Alexandria, VA (US); Michael Schuette, Vienna, VA (US); Joseph Rodgers, Jessup, MD (US); Chris Netwall, Annandale, VA (US)

(72) Inventors: Benjamin D. Gould, Alexandria, VA (US); Ravi Ramamurti, Silver Spring, MD (US); Karen Swider-Lyons, Alexandria, VA (US); Michael Schuette, Vienna, VA (US); Joseph Rodgers, Jessup, MD (US); Chris Netwall, Annandale, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 892 days.

(21) Appl. No.: 14/868,513

(22) Filed: Sep. 29, 2015

(65) Prior Publication Data
US 2016/0093898 A1    Mar. 31, 2016

Related U.S. Application Data
(60) Provisional application No. 62/057,337, filed on Sep. 30, 2014.

(51) Int. Cl.
*H01M 8/026* (2016.01)
*B22F 3/105* (2006.01)
(Continued)

(52) U.S. Cl.
CPC .......... *H01M 8/026* (2013.01); *B22F 3/1055* (2013.01); *C22C 14/00* (2013.01); *C23C 8/02* (2013.01);
(Continued)

(58) Field of Classification Search
CPC .................................................. H01M 2/0256
See application file for complete search history.

(56) References Cited

U.S. PATENT DOCUMENTS

| 5,186,806 A * | 2/1993 | Clark ................. B01D 53/326 |
| | | 204/265 |
| 5,616,431 A | 4/1997 | Kusunoki et al. |

(Continued)

FOREIGN PATENT DOCUMENTS

DE    102013221012 A1 *  4/2015  ............. H01M 8/02

*Primary Examiner* — Jeremiah R Smith
(74) *Attorney, Agent, or Firm* — US Naval Research Laboratory; Richard F. Bis (57) ABSTRACT

A bipolar plate for a fuel cell is provided. The bipolar plate includes a main body with a first end and a second end spaced from the first end along a longitudinal axis of the main body. At least one inlet is disposed at the first end of the main body. At least one outlet corresponding to the at least one inlet is disposed at the second end of the main body. At least one continuous flow path extends from the at least one inlet to the at least one outlet. The main body comprises a single, contiguous piece.

9 Claims, 7 Drawing Sheets

(51) Int. Cl.

| | | |
|---|---|---|
| *C22C 14/00* | (2006.01) | |
| *C23C 8/24* | (2006.01) | |
| *C25F 3/16* | (2006.01) | |
| H01M 8/0208 | (2016.01) | |
| H01M 8/0263 | (2016.01) | |
| *C23C 14/16* | (2006.01) | |
| *C23C 8/02* | (2006.01) | |
| *B33Y 10/00* | (2015.01) | |
| *B33Y 80/00* | (2015.01) | |
| *H01M 8/0232* | (2016.01) | |
| *H01M 8/0267* | (2016.01) | |
| *H01M 8/0247* | (2016.01) | |
| *H01M 8/0258* | (2016.01) | |
| *H01M 8/1018* | (2016.01) | |
| *C22C 1/04* | (2006.01) | |

(52) U.S. Cl.
CPC .............. *C23C 8/24* (2013.01); *C23C 14/165* (2013.01); *C25F 3/16* (2013.01); *H01M 8/0208* (2013.01); *H01M 8/0263* (2013.01); *B22F 2998/10* (2013.01); *B33Y 10/00* (2014.12); *B33Y 80/00* (2014.12); *C22C 1/0458* (2013.01); *H01M 8/0232* (2013.01); *H01M 8/0247* (2013.01); *H01M 8/0258* (2013.01); *H01M 8/0267* (2013.01); *H01M 2008/1095* (2013.01); *Y02P 10/295* (2015.11)

(56) References Cited

U.S. PATENT DOCUMENTS

| | | | |
|---|---|---|---|
| 6,261,710 B1 | 7/2001 | Marianowski | |
| 6,838,202 B2 | 1/2005 | Brady et al. | |
| 6,974,648 B2 | 12/2005 | Goebel | |
| 7,306,875 B2 | 12/2007 | Garceau | |
| 7,459,227 B2 | 12/2008 | Rock et al. | |
| 7,781,087 B2 | 8/2010 | Rock et al. | |
| 7,805,834 B2 | 10/2010 | White et al. | |
| 8,158,299 B2 | 4/2012 | Blank et al. | |
| 8,236,461 B2 | 8/2012 | Gao | |
| 8,263,259 B2 | 9/2012 | Kearl | |
| 8,389,182 B2 | 3/2013 | Owejan et al. | |
| 8,450,023 B2 | 5/2013 | Conti et al. | |
| 8,501,364 B2 | 8/2013 | Owejan et al. | |
| 8,623,565 B2 | 1/2014 | Das et al. | |
| 8,889,314 B2 | 11/2014 | Connor et al. | |
| 2003/0203260 A1 | 10/2003 | Lee | |
| 2004/0209150 A1* | 10/2004 | Rock | H01M 8/0258 429/434 |
| 2005/0260473 A1* | 11/2005 | Wang | B82Y 30/00 429/492 |
| 2006/0134502 A1* | 6/2006 | Garceau | H01M 8/0206 429/434 |
| 2009/0092872 A1* | 4/2009 | Miyazawa | H01M 8/0206 429/434 |
| 2010/0035118 A1* | 2/2010 | Sato | C22C 5/02 429/437 |
| 2011/0207026 A1 | 8/2011 | Tseng et al. | |
| 2012/0183881 A1* | 7/2012 | Sugita | H01M 8/0247 429/482 |
| 2013/0089809 A1 | 4/2013 | Farrington | |

\* cited by examiner

000
THREE-DIMENSIONALLY PRINTED BIPOLAR PLATE FOR A PROTON EXCHANGE MEMBRANE FUEL CELL

RELATED APPLICATIONS

The present application is related to, and claims the benefit of priority to, U.S. Provisional Application No. 62/057,337, entitled PROTON EXCHANGE MEMBRANE FUEL CELL WITH 3-D PRINTED BIPOLAR PLATES, filed on Sep. 30, 2014, having at least two of the same inventors Benjamin D. Gould and Joseph A. Rodgers and assigned to the same entity, i.e., the U.S. Government, as the present disclosure, and is herein incorporated by reference in its entirety.

FIELD OF THE DISCLOSURE

The present disclosure relates to generation of electrical power using fuel cells. More particularly, the present disclosure provides a novel way to manufacture fuel cell bipolar plates with the advantage of rapid prototyping, one piece design, hollow structures and weight savings, as well as providing an assembly procedure to reduce contact resistance.

BACKGROUND OF THE DISCLOSURE

Previous state of the art processes for manufacturing fuel cell bipolar plates include machining together molded carbon and formed metal foils. The major limitation of these past processes is that they require expensive tooling that cannot be reconfigured rapidly to incorporate new design. These processes lead to two piece bipolar plates that require an extra set of gasket seals and grooves needed to seal the fuel cell stack in the assembly steps to build a functioning fuel cell. Specifically, creating a typical bipolar plate involves welding together at least two pieces. This welded portion is then provided with gasket seals, which can leak or otherwise become damaged, in addition to forming grooves in the welded portion to accommodate the seals.

SUMMARY OF THE DISCLOSURE

In one embodiment, a bipolar plate for a fuel cell is provided. The bipolar plate includes a main body with a first end and a second end spaced from the first end along a longitudinal axis of the main body. At least one inlet is disposed at the first end of the main body. At least one outlet corresponding to the at least one inlet is disposed at the second end of the main body. At least one continuous flow path extends from the at least one inlet to the at least one outlet. The main body comprises a single, contiguous piece.

In another embodiment, a bipolar plate for a fuel cell is provided. The bipolar plate includes a main body with a first end and a second end spaced from the first end along a longitudinal axis of the main body. At least one inlet is disposed at the first end of the main body. At least one outlet corresponding to the at least one inlet is disposed at the second end of the main body. At least one continuous flow path extends from the at least one inlet to the at least one outlet. The at least one continuous flow path has a corrugated, I-beam shape. A reactant boss seal is in fluid communication with the at least one continuous flow path. The reactant boss seal provides fluid communication between the at least one continuous flow path and the at least one inlet. The main body comprises a single, contiguous piece.

In another embodiment, a method of manufacturing a bipolar plate for a proton exchange membrane fuel cell is provided. The method includes designing a bipolar plate for a fuel cell in which the bipolar plate including at least one continuous flow path; three-dimensionally printing the bipolar plate with a direct metal laser sintering process in which the bipolar plate being printed as a single, contiguous piece; polishing the bipolar plate; and surface-coating the bipolar plate.

DETAILED DESCRIPTION OF THE DISCLOSURE

Proton exchange membrane fuel cells are devices used to generate electrical power from the reaction of hydrogen with oxygen. In a proton exchange fuel cell, an oxidation-reduction reaction occurs in which hydrogen gas (which serves as fuel) is dissociated to form two protons and two electrons. The protons react with one oxygen atom (provided from oxygen gas ($O_2$) present in the air). The remaining two electrons pass through an external circuit to provide electromotive force and complete the reaction with oxygen to form water and heat. Typical bipolar plates include one or more inlets to receive the hydrogen fuel, oxygen gas, and water (which serves as a coolant for the fuel cell). Specifically, there is one inlet for the hydrogen fuel, one inlet for the air, and one inlet for the water. Each inlet interacts with a corresponding outlet. The inlets are in fluid communication with the corresponding outlets via a flow path that traverses a portion of the bipolar plate.

The objective of this disclosure is to create bipolar plates for fuel cells with the advantages of: (1) rapid prototyping; (2) one piece design; (3) hollow structures; (4) possible weight savings; and (5) providing an assembly procedure to reduce contact resistance, shown from the design of solid models of the plates. As a result, a bipolar plate can be rapidly built from a base powder material, and the final bipolar plate is manufactured as one piece. For example, the bipolar plate can be manufactured using three-dimensional (3D) printing, as described in more detail below. A direct metal laser sintering process can be used to 3D print (i.e. build) the bipolar plate. In some embodiments, the bipolar plate includes a printed reactant boss seal to provide sealing and reactant flow therethrough. The bipolar plate includes a hollow flow path that that allows for the removal of powder after the sintering process. Advantageously, once the bipolar plate is formed, it can be assembled with any standard fuel cell that is known in the art. The assembly process uses compressive cycling to minimize the contact resistance. An optimal range of surface finishes can be 1.5 to 5 $S_a$ microns.

Figure 1:
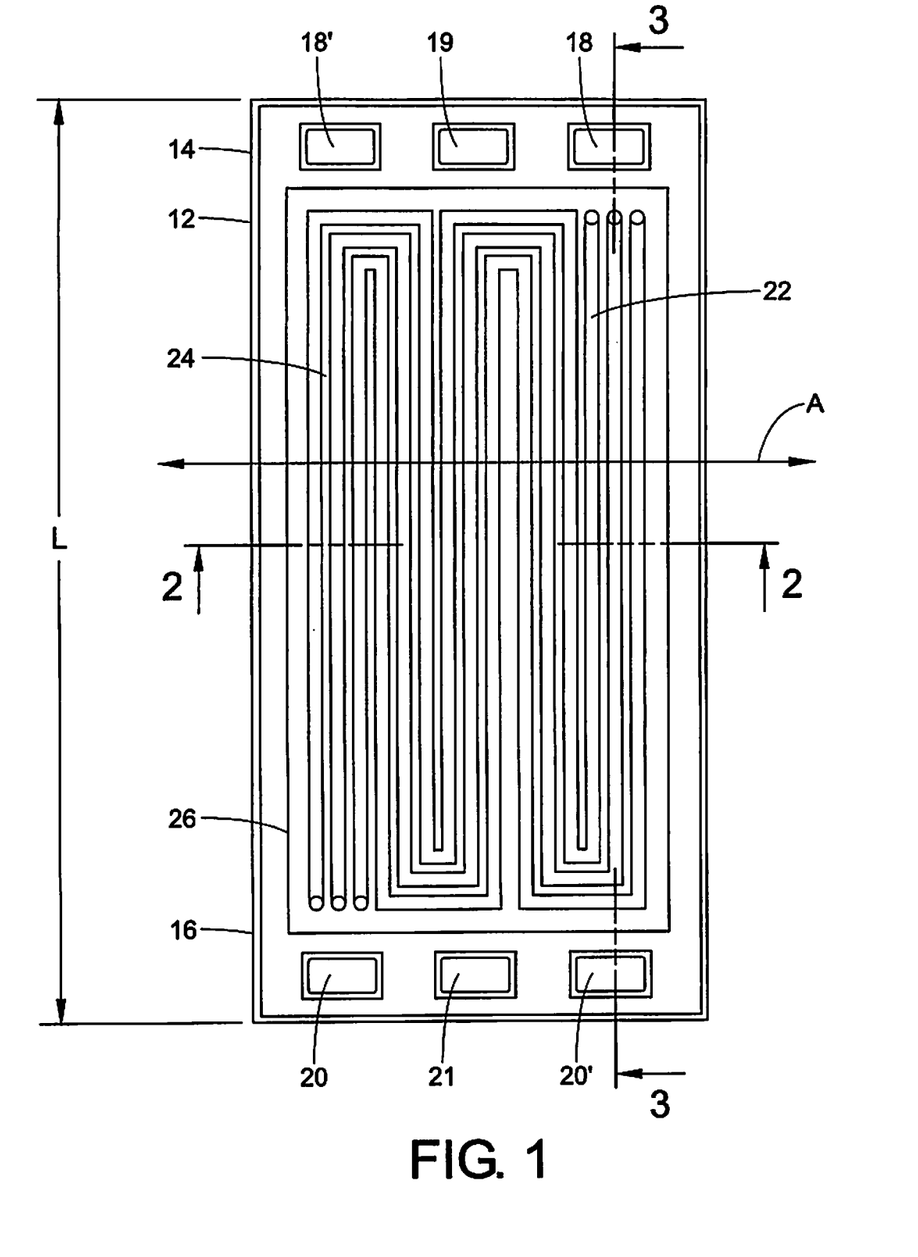
FIG. 1 illustrates a top view of a first embodiment of a bipolar plate in one accordance of the present disclosure.

FIG. 1 shows a top planar view of a 3D printed bipolar plate 10 for a fuel cell (not shown). The bipolar plate 10 includes a main body 12 with a first end 14 and a second end 16 spaced from the first end along a longitudinal axis A of the main body. At least one inlet 18, 18' 19 is disposed at the first end 14. Each inlet 18, 18' 19 is in fluid communication with a corresponding outlet 20, 20', 21 disposed at the second end. Each individual inlet 18, 18' 19 is configured to receive at least one of hydrogen fuel, air containing oxygen gas, and water (described above), and the corresponding outlet 20, 20', 21 is configured to expel water, heat, and the like from the bipolar plate 10. The inlets 18, 18' 19 and the outlets 20, 20', 21 are connected via at least one continuous flow path 22 that extends between the first and second ends 14 and 16. In some embodiments, at least one of the flow paths can be disposed along an exterior portion of the main body 12, as described in more detail below. In other embodiments, at least one of the flow paths can be disposed with an interior of the main body 12. In this embodiment, the flow path is defined as a hollow passageway extending through, and within, a solid interior 24 of the main body 12. It will be appreciated that the solid interior 24 of the main body 12 is the interior portion of the main body that does not include the inlets 18. 18', 19; the outlets 20, 20', 21; and the at least one flow path 22 (e.g., the hollow portions of the main body). As shown in FIG. 1, the at least one flow path 22 extends substantially across a length L of the main body 12. However, it will be appreciated that the at least one flow path 22 can extend across any suitable length of the main body 12. FIG. 1 also shows that the at least one flow path 22 has a triple serpentine flow path (although the flow path can have any type of flow path). The main body 12 also includes an exterior surface 26.

The main body 12 can be substantially made from a base material, such as a Ti-6Al-4V alloy; however, it will be appreciated that main body can comprise another suitable alloy or combination of alloys (e.g., 316 stainless steel, commercially pure titanium (TiCP) and aluminum alloy (AlSi10Mg), austenitic steels, ferrous steels, aluminum alloys, titanium alloys, pure aluminum and pure titanium and the like). The main body 12 can have dimensions ranging from approximately 40 mm to approximately 100 mm in width, and from approximately 80 mm to approximately 120 mm in length. For example, the main body 12 can have a width of approximately 40.0 mm (inclusive), and a length of approximately 80.0 mm (inclusive). However, it will be appreciated that the main body 12 can have any suitable dimensions to allow: (1) the at least flow path 22 to be disposed within the main body; and (2) allow the bipolar plate 10 to be a component of a fuel cell (not shown). The main body 12 is sized and dimensioned such that the at least one flow path 22 extends across a portion of the width of the main body and extends across a portion of the length of the main body, depending on the selected dimensions of the main body 12. The main body 12 includes a portion over which the at least one flow path 22 does not extend across to accommodate the inlets and the outlets 18 and 20 (e.g., typical approximately 7.5 mm of the length and the width of the main body 12). For example, the at least one flow path 22 can extend across a portion of the width of the main body 12, ranging from approximately 33 mm to approximately 68 mm, and across a portion of the length of the of the main body, ranging from approximately 65 mm to approximately 105 mm. Advantageously, the main body 12 of the bipolar plate 10 can be formed as a single, contiguous piece, as described in more detail below.

Figure 2:
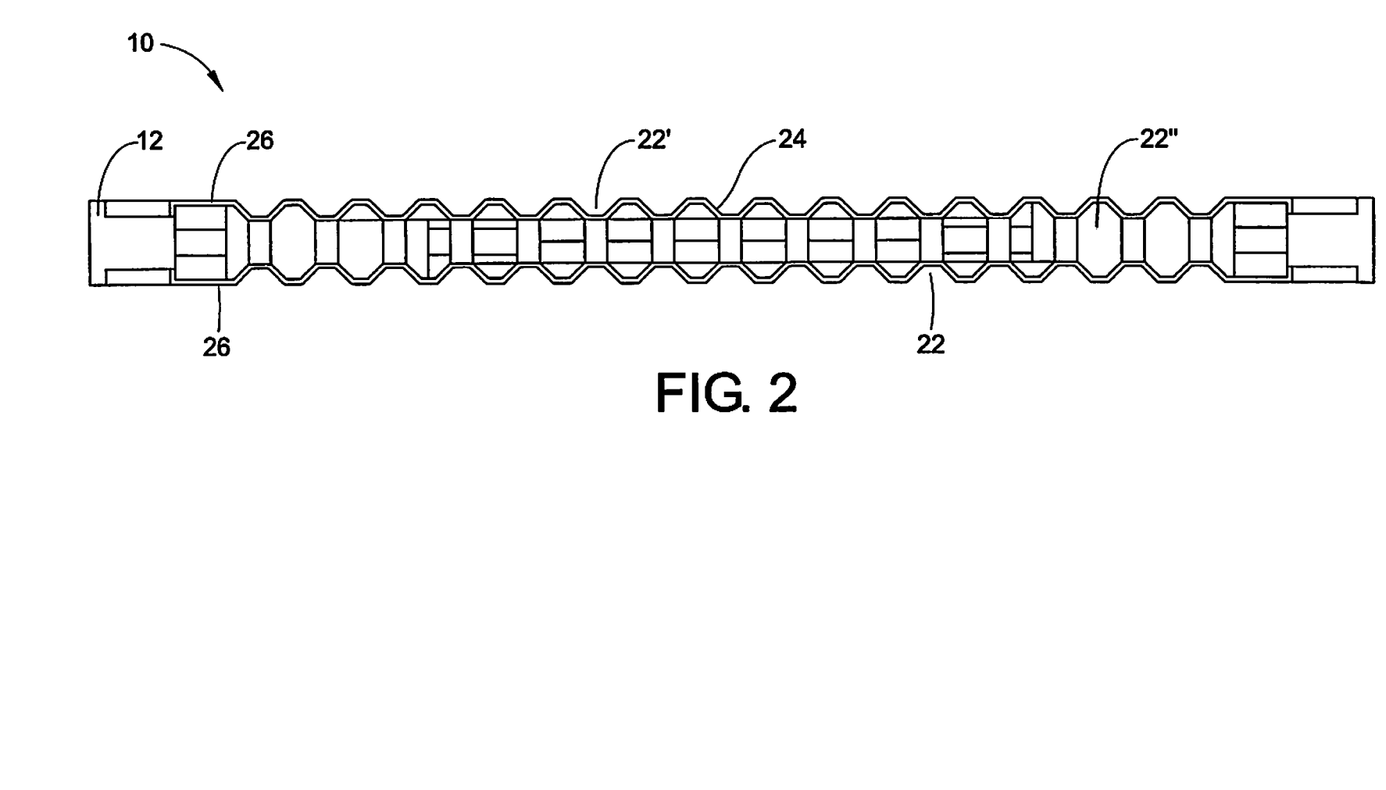
FIG. 2 illustrates a cross-sectional view of bipolar plate taken along line 2-2 of FIG. 1.

Referring to FIG. 2, and with continuing reference to FIG. 1, the main body 12 includes three inlets 18, 18', 19, three corresponding outlets 20, 20', 21, and three flow paths 22, 22', 22". However, the main body 12 can include any suitable number of inlets, outlets, and/or flow paths. As described above, each individual inlet 18, 18', 19 is configured to receive at least one of: hydrogen fuel, air containing oxygen gas, and coolant water; flow through one of the flow paths 22, 22', 22"; and the corresponding outlet 20, 20', 21 is configured to expel water, heat, and the like from the bipolar plate 10. In some embodiments, a first inlet 18 is configured to receive air containing oxygen, a second inlet 18' is configured to receive hydrogen fuel, and a third inlet 19 is configured to receive water. The corresponding outlets 20, 20', 21, are configured to expel water, heat, and the like from the bipolar plate 10. The first inlet 18 and the first outlet 20 are in fluid communication with each other via a first flow path 22, the second inlet 18' and the second outlet 20' are in fluid communication with each other via a second flow path 22', and the third inlet 19 and the third outlet 21 are in fluid communication with each other via a third flow path 22". As shown in FIG. 1, the first flow path 22 has a triple serpentine (i.e., with three channels) flow configuration, such that the first inlet 18 is disposed on a "right" portion of the main body 12, and the first outlet 20 is disposed on a "left" portion of the main body. Similarly, the second flow path 22' (not shown in FIG. 1) has a serpentine flow configuration (i.e., with three flow channels), such that the second inlet 18' is disposed on the "left" portion of the main body 12, and the second outlet 20' is disposed on the "right" portion of the main body. The third flow path 22" has a substantially straight flow configuration, such that the third inlet 19 and the third outlet 21 are disposed on a "center" portion of the main body. However, it will be appreciated that the inlets 18, 18', 19 and the outlets 20, 20', 21 can be disposed on the main body 12 in any suitable configuration.

FIG. 2 is a cross-sectional view of the main body 12, taken along line 2-2 of FIG. 1. FIG. 2 shows the configuration of the flow paths 22, 22', 22". The third flow path 22" is illustrated in FIG. 2 as being hollow to allow water coolant to pass therethrough. In order to allow coolant to pass therethrough, the third flow path 22" has a substantially corrugated cross-sectional shape. Stated another way, the third flow path 22" has a substantially I-beam cross-sectional shape. It will be appreciated that the flow path 22 can have any other suitable cross-sectional shape (e.g., circular, elliptical, n-sided polygonal, and the like) such that the flow path acts an open, straight-through passageway to remove powder from the building process, as described in more detail below. Advantageously, the open and straight design of the coolant third flow path 22" makes powder removal possible by optimization of the orientation to optionally include one or more tabs (not shown in FIG. 2).

Additionally, FIG. 2 shows the configuration of the first and second flow paths 22 and 22'. The first and second flow paths 22 and 22' are defined by the exterior surface 26 on opposing top and bottom sides of the main body 12. The first and second flow paths 22 and 22' are shown as having trapezoidal cross-sectional shapes; although the first and second flow paths can have any suitable cross-sectional shape (e.g., circular, elliptical, n-sided polygonal, and the like). Stated another way, the third flow path 22" is "sandwiched" between the first and second flow paths 22 and 22'. It will be appreciated that the first and second flow paths 22 and 22' can be configured substantially identically to each other. As described above, the first flow path 22 is configured to provide fluid communication for the air containing oxygen gas between the first inlet and outlet 18 and 20. In other words, air containing oxygen gas is flowed across a top portion of the main body 12 (via the first flow path 22). The second flow path 22' is configured to provide fluid communication for the hydrogen fuel between the second inlet and outlet 18' and 20'. In other words, hydrogen fuel is flowed across a bottom portion of the main body 12 (via the second flow path 22'). However, it will be appreciated that the configurations of the first and second flow paths 22 and 22' can be reversed such that hydrogen fuel is flowed across the top portion of the main body 12, and the air containing oxygen gas can be flowed across the bottom portion of the main body 12.

Figure 3:
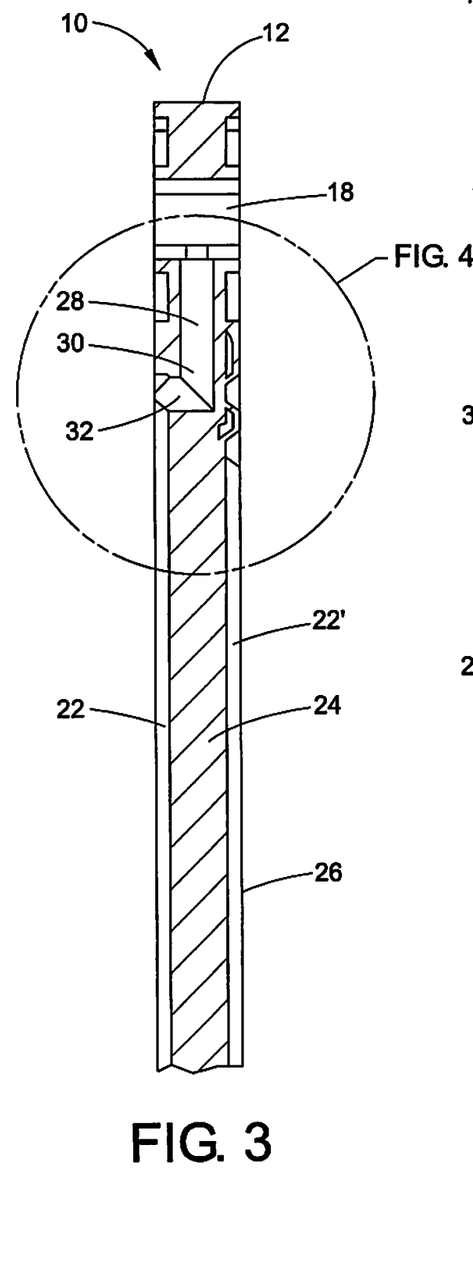
FIG. 3 illustrates a cross-sectional view taken along line 3-3 of FIG. 1.
Figure 4:
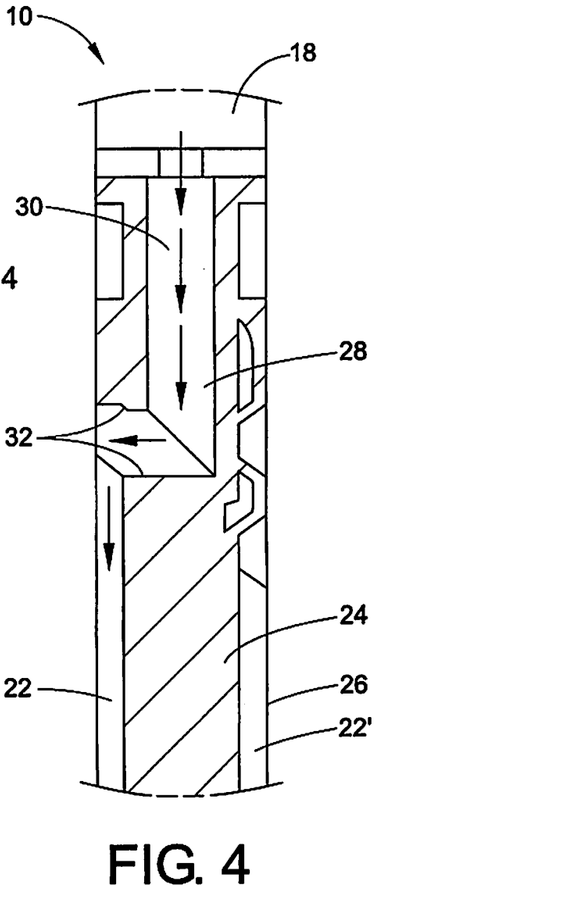
FIG. 4 illustrates an enlarged view taken along section 4 of FIG. 3.

FIG. 3 is another cross-sectional view of the main body 12, taken along line 3-3 of FIG. 1. FIG. 3 shows a reactant boss seal 28 that is in fluid communication with the first inlet 18 and the first flow path 22. The reactant boss seal 28 helps to channel chemical reactants (e.g., hydrogen and oxygen) to a catalyst coated membrane (not shown) so that the oxidation-reduction reaction, as described above, occurs. Although the reactant boss seal 28 is shown in fluid communication with the first flow path 22 (i.e., the flow path that receives air containing oxygen), it will be appreciated that the reactant boss seal 28 can additionally or alternatively be in fluid communication with the second inlet 18' and the second flow path 22' (i.e., the flow path that receives hydrogen fuel). Advantageously, the reactant boss seal 28 is unique to the 3D printed bipolar plate 10, and cannot be included in typical metal bipolar plates. In typical bipolar plates, at least two metal pieces are welded (or otherwise attached together), which requires an extra set of gasket seals and grooves needed to seal the fuel cell stack in the assembly steps to build a functioning fuel cell, making the formation of a reactant boss seal impossible. As shown in FIG. 4, the reactant boss seal 28 includes a passageway 30 that provides an easily re-configurable interconnect for air that is received in the first inlet 18 to be flowed to the first flow path 22. A reactant boss seal main body 32 defines the passageway 30 such that the passageway extends through the reactant boss seal main body. A path of air flow is denoted by arrows in FIG. 4. The path flows form the first inlet 18, past the reactant boss seal 28 and to the first flow path 22.

Figure 5:
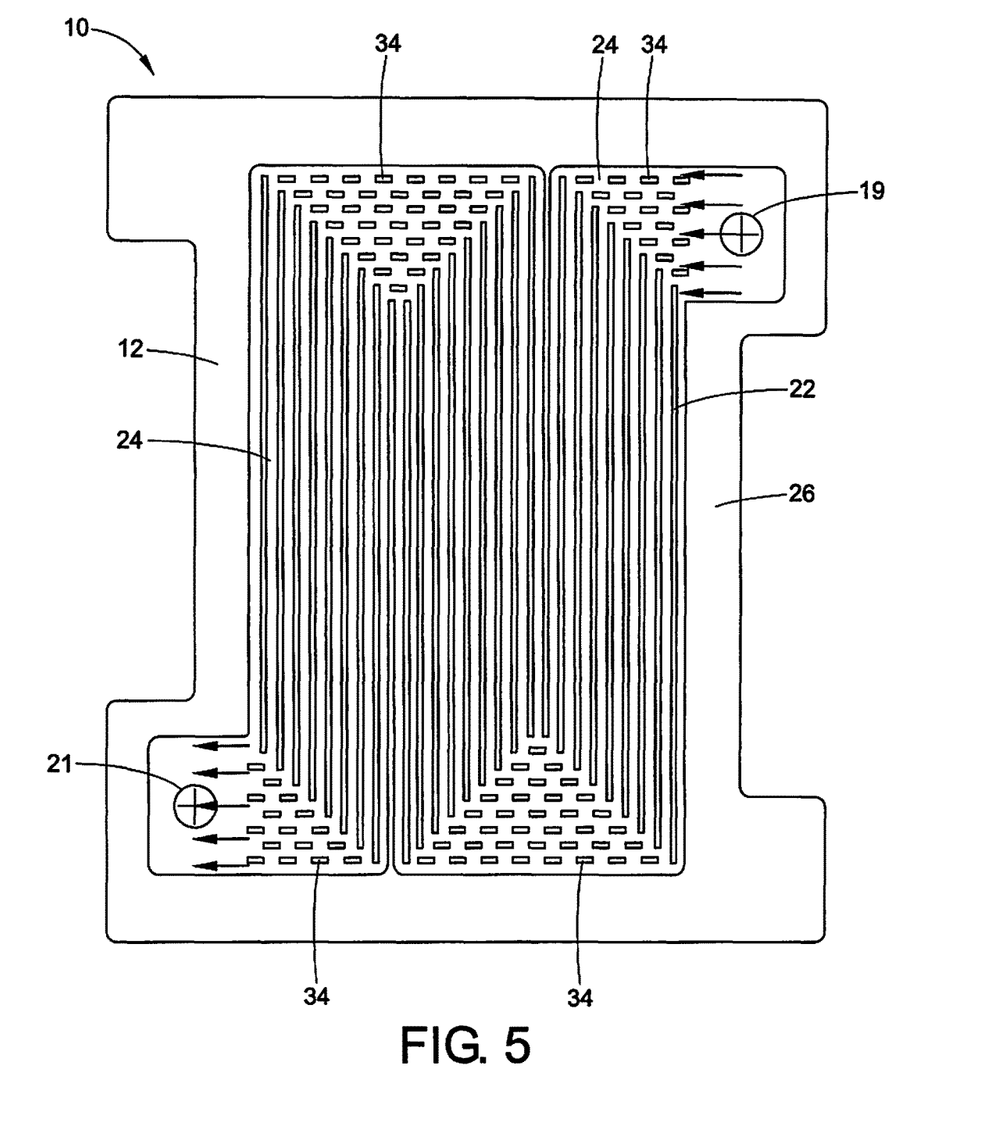
FIG. 5 illustrates an alternative embodiment of the bipolar plate of FIG. 1.

FIG. 5 shows an alternative embodiment of the main body 12. As shown in FIG. 5, at least one mixing tab 34 disposed with the third flow path 22". The mixing tabs 34 are horizontally oriented relative to the main body 12. Advantageously, the mixing tabs 34 are configured to help clear bubbles in the coolant during fluid flow through the third flow path 22". The mixing tabs 34 can be disposed along one or more portions of the third flow path 22". For example, the mixing tabs 34 can be configured as a protrusion extending from the solid interior 24 of the main body 12 into a portion of the third flow path 22". The mixing tabs 34 can be configured as an array within the third flow path 22". The mixing tabs 34 can have any suitable shape (e.g., circular, elliptical, n-sided polygonal, and the like).

Figure 6:
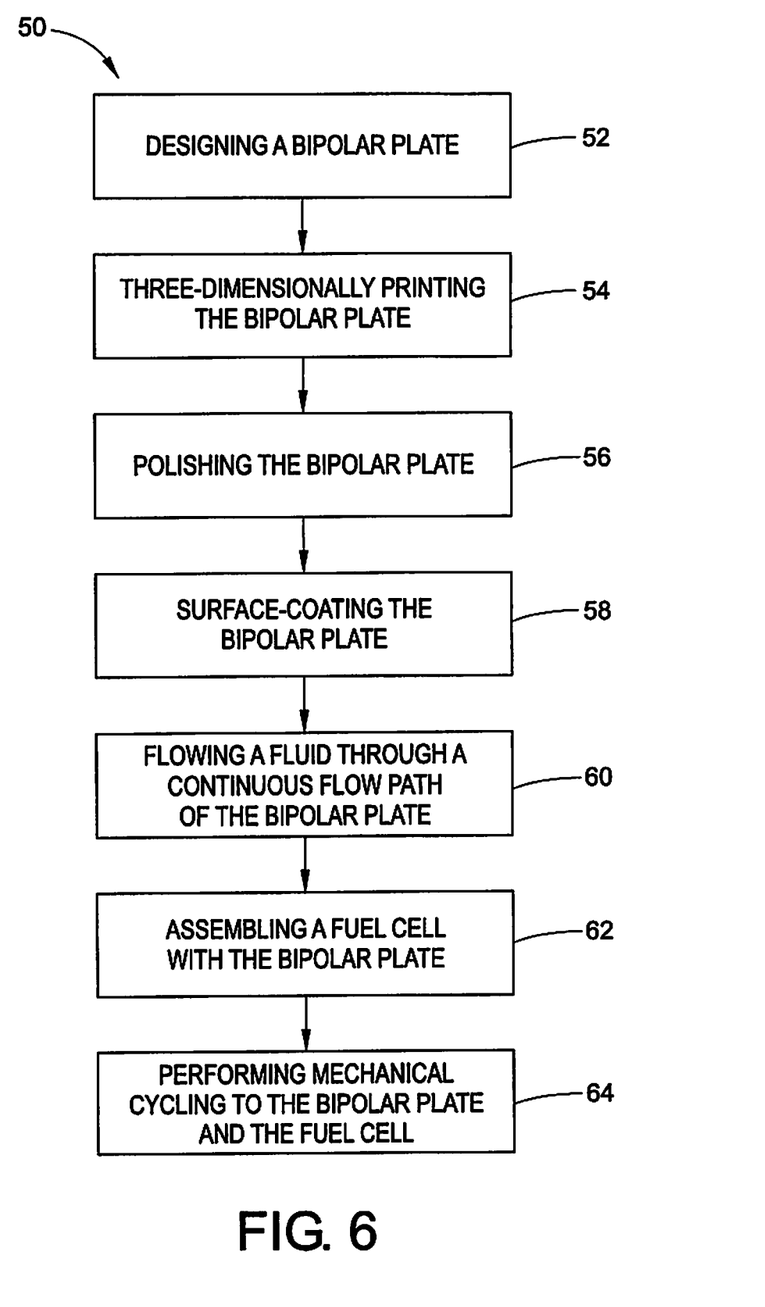
FIG. 6 illustrates a flow chart showing an exemplary process to manufacture the bipolar plate of FIG. 1.

FIG. 6 depicts a method 50 for manufacturing the 3D-printed bipolar plate 10. The method 50 includes: designing a bipolar plate 10 for a fuel cell (52); three-dimensionally printing the bipolar plate with a direct metal laser sintering process (54); polishing the bipolar plate (56); surface-coating the bipolar plate (58); flowing a fluid through a continuous flow path 22 (60); assembling a fuel cell with at least one bipolar plate (62); and performing mechanical cycling to the bipolar plate and the fuel cell (64).

At 52, the bipolar plate 10 is designed for a fuel cell, such as a proton exchange membrane fuel cell. The bipolar plate 10 can be designed on a computer. This allows the bipolar plate 10 to be printed with a 3D printer that is connected to the computer. The bipolar plate 10 can be designed (as described above) to include the main body 12 with the flow path 22 that fluidly connects the inlets 18 and the outlets 20. The bipolar plate 10 can be designed to additionally and optionally include at least one of the reactant boss seal 28 and the mixing tabs 34 (each of which is described above). As such, it will be appreciated that multiple designs of the bipolar plate 10 can be generated.

At 54, the bipolar plate 10 is three-dimensionally printed with a direct metal laser sintering process (or any other suitable process, such as electron beam melting). The main body 12 of the bipolar plate 10 can be three-dimensionally printed with at least a Ti-6Al-4V alloy (or any other suitable alloy or combination of alloys). During the direct metal laser sintering process, the continuous flow path 22 is formed within the solid interior 24 of the main body 12. The continuous flow path 22 can be formed to include at least one of: (1) a corrugated, I-beam cross-sectional shape; and (2) a triple serpentine flow path that substantially extends across a length of the main body 12. Advantageously, the bipolar plate 10 can be printed as a single, contiguous piece, thereby creating a bipolar plate that does not have at least two pieces welded together and provided with gasket seals and corresponding grooves. Additionally, at 54, the at least one mixing tab 34 can be formed within the continuous flow path 22. Advantageously, the mixing tabs 34 can help remove bubbles during fluid flow through the flow path 22. Additionally, the reactant boss seal 28 can be formed within the continuous flow path 22. Advantageously, (1) the reactant boss seal 28 provides fluid communication between the flow path 22 and the inlets 20, and (2) can only be formed by 3D design and printing, since the welding of two metal pieces to form a bipolar plate would prevent the reactant boss seal from being formed in such a bipolar plate.

At 56, the bipolar plate 10 is polished. Specifically, the exterior surface 26 of the main body 12 is polished. The main body 12 can be polished with at least one of a physical polishing process, an electro-polishing process, and a mechanical-physical-catalyst process, (although any other suitable polishing process can be used). Preferably, the mechanical-physical catalyst polishing process is used. The exterior surface 26 of the main body 12 can be polished to include a surface roughness between approximately 1.5 $S_a$ microns (inclusive) to approximately 5.0 $S_a$ microns (inclusive).

At 58, the bipolar plate 10 is surface-coated. Specifically, the exterior surface 26 of the main body 12 is surface-coated after the exterior surface is polished. The surface-coating advantageously enhances electron conductivity and retard corrosion, thereby minimizing contact resistance through surface coatings, corrosion protection and proper surface finish. The exterior surface 26 can be surface coated with at least one of a gold-sputtering process, a coat electro-deposited coating process, a nitride coating process, and a $TiO_2$/gold nano-dot coating process. Preferably, the $TiO_2$/gold nano-dot coating process is used using TiO2/gold nano-dot coatings available from TREADSTONE TECHNOLOGIES, INC. (Princeton, N.J., U.S.A.). Such TiO2/gold nano-dot coatings are described in U.S. Patent Publication No. 2014/0224650, which is incorporated herein by reference in its entirety.

At 60, after three-dimensionally printing the bipolar plate 10 with a direct metal laser sintering process (54), a fluid is flowed through the continuous flow path 22. The fluid can be any suitable liquid (e.g., water) or gas (e.g., air), and is flowed through the flow path 22 to remove any debris (such as powder) that is disposed within the flow path. During formation of the bipolar plate 10 (and specifically the flow path 22), powder from the base material (e.g., the Ti-6Al-4V alloy) can collect within the flow path. The fluid is flowed through the flow path 22 to remove this powder, and any other debris disposed therein, so that air can flow uninterrupted through the flow path from the inlets 18 to the outlets 20.

At 62, the bipolar plate 10 is assembled into a fuel cell (not shown). For example, at least one bipolar plate 10 is sandwiched between at least one catalyst coated membrane (not shown) and at least one gas diffusion layer (not shown). One or more gaskets (not shown) can be disposed between the bipolar plate(s) 10 and the catalyst coated membrane or gas diffusion layer. The fuel cell (including the bipolar plates 10) is then compressed together and secured with screws. However the fuel cell can be secured with any suitable attachment mechanism (e.g., magnets, buckles, hook and loop arrangements, straps, snaps, and the like.

Figure 7:
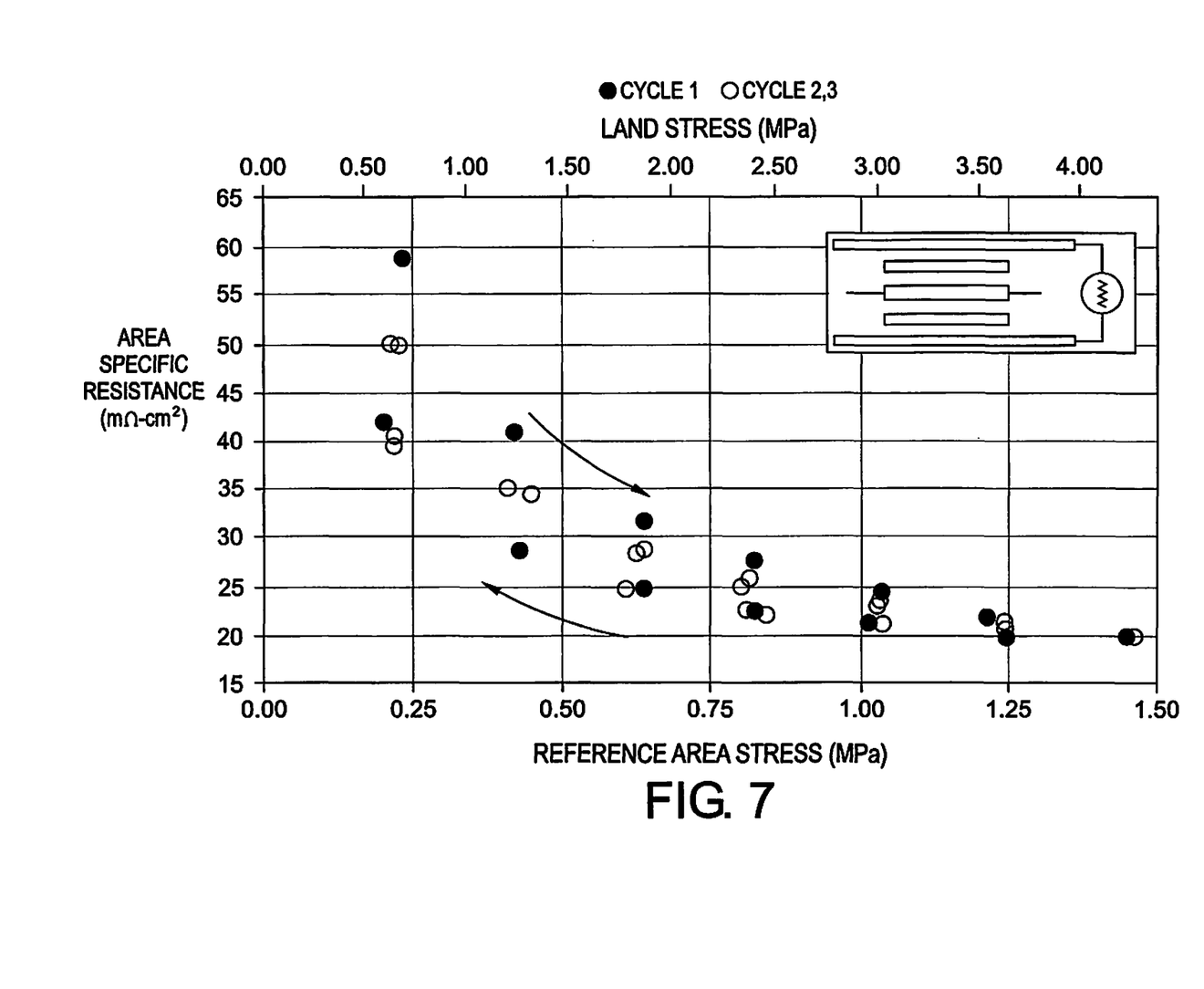
FIG. 7 illustrates a schematic graph showing compressive cycling of mechanical break-in of simplified test cell with a gas diffusion layer and a bipolar plate of FIG. 1.

At 64, after the bipolar plate 10 is assembled into the fuel cell, a mechanical cycling process is performed to reduce contact resistance between the bipolar plate and the remainder of the fuel cell. Multiple fuel cells can be assembled together to form a stack. Assembly of the bipolar plates into a stack of cells is common practice for those skilled in the art. After the stack is assembled it is important consider compressive strength by compressing the whole assembly to >1.0 mega-pascal (MPa) and released to <0.25 MPa and returned to >1.0 MPa. The processes are known in the art. FIG. 7 illustrates a schematic graph showing compressive cycling of mechanical break-n (inset) of simplified test cell with a gas diffusion layer (not shown) and the bipolar plate 10; and the hysteresis in contact resistance is shown in FIG. 7. It will be appreciated that compression cycling processing is optimized to minimize contact resistance during stack compression.

Figure 8:
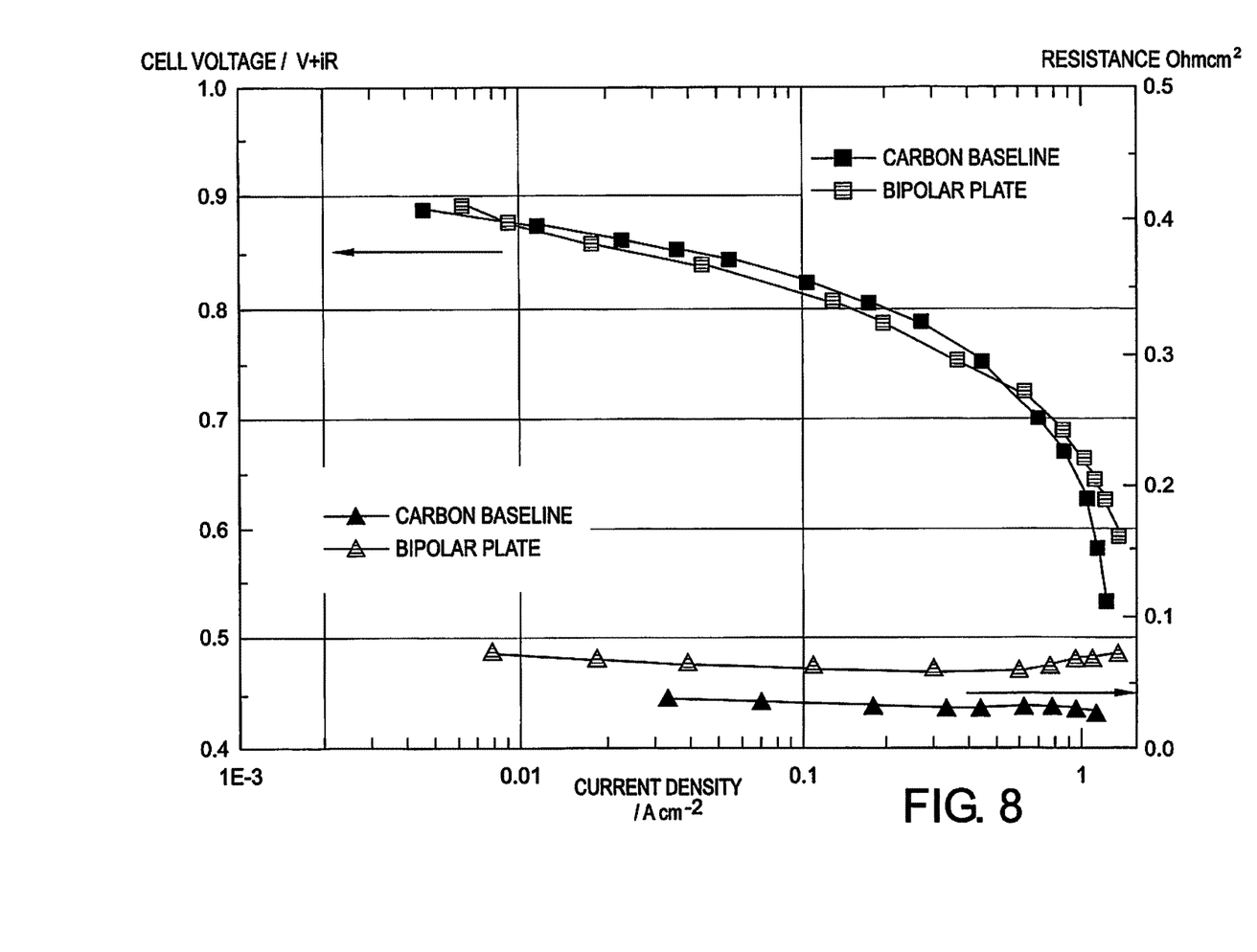
FIG. 8 illustrates a summary of performance of different bipolar plate designs from three-dimensional printing.

The results summarizing the performance of the design of the bipolar plate 10 against a bipolar plate made from a carbon baseline material are presented in FIG. 8. As shown in FIG. 8, the bipolar plate 10 exhibits: (1) improved cell voltage performance as a function of density as opposed to the bipolar plate made from a carbon baseline material; and (2) improved resistance performance as a function of density as opposed to the bipolar plate made from a carbon baseline material.

It will be appreciated that the processes 52-62 can be performed in any suitable order, except as specified above. For example, flowing the fluid through the flow path 22 (described at 60) can be performed before polishing the bipolar plate 10 (described at 56) and/or surface-coating the bipolar plate (described at 58). Additionally, forming the mixing tabs 34 and/or the reactant boss seal 28 can be optionally performed as sub-processes of the direct laser sintering process (described at 54).

This disclosure could apply to electron beam melting or any other additive manufacturing process used to form parts from electronically conductive materials. Although the preferred embodiment of this disclosure is for use in fuel cells it could be used in any other gas-electrode application.

The foregoing description of the specific embodiments will so fully reveal the general nature of the disclosure that others can, by applying knowledge within the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments claimed herein and below, based on the teaching and guidance presented herein and the claims which follow:

What is claimed is:

1. A bipolar plate for a fuel cell, the bipolar plate comprising:
    a main body including a first end and a second end spaced from the first end along a longitudinal axis of the main body;
    at least one inlet disposed at the first end of the main body;
    at least one outlet corresponding to the at least one inlet, the at least one outlet being disposed at the second end of the main body; and
    at least one continuous flow path extending from the at least one inlet to the at least
    one outlet;
    wherein the main body comprises a single, contiguous piece, and
    wherein the main body has, in cross-section, a repeating, corrugated, I-beam shape including flange portions connected by a web portion, and wherein the at least one continuous flow path has an n-sided polygonal cross-sectional shape, at least one side of the n-sided polygonal shape defined by the web portion of the I-beam shape of the main body.

2. The bipolar plate of claim 1, wherein the main body comprises at least a Ti-6Al-4V alloy.

3. The bipolar plate of claim 1, wherein the at least one continuous flow path includes three continuous flow paths arranged in a triple serpentine flow path configuration.

4. The bipolar plate of claim 1, wherein the main body includes a reactant boss seal in fluid communication with the at least one continuous flow path, the reactant boss seal providing fluid communication between the at least one continuous flow path and the at least one inlet.

5. The bipolar plate of claim 1, further including an array of mixing tabs disposed within and causing a discontinuous flow path between the at least one inlet and the at least one outlet, the mixing tabs being horizontally oriented relative to the main body.

6. A fuel cell comprising the bipolar plate of claim 1.

7. A bipolar plate for a fuel cell, the bipolar plate comprising:
    a main body including a first end and a second end spaced from the first end along a longitudinal axis of the main body;
    at least one inlet disposed at the first end of the main body;
    at least one outlet corresponding to the at least one inlet, the at least one outlet being disposed at the second end of the main body; and
    at least one continuous flow path extending from the at least one inlet to the at least one outlet; and
    a reactant boss seal in fluid communication with the at least one continuous flow path, the reactant boss seal providing fluid communication between the at least one continuous flow path and the at least one inlet;
    wherein the main body comprises a single, contiguous piece and has, in cross-section, a repeating, corrugated, I-beam shape including flange portions connected by a web portion, and wherein the at least one continuous flow path has an n-sided polygonal cross-sectional shape, at least one side of the n-sided polygonal shape defined by the web portion of the I-beam shape of the main body.

8. The bipolar plate of claim 7, wherein the main body comprises at least a Ti-6Al-4V alloy.

9. A fuel cell comprising the bipolar plate of claim 7.

* * * * *